(12) United States Patent
Mizuno

(10) Patent No.: US 11,107,637 B2
(45) Date of Patent: Aug. 31, 2021

(54) VARIABLE CAPACITANCE ELEMENT

(71) Applicant: Murata Manufacturing Co., Ltd., Nagaokakyo (JP)

(72) Inventor: Takaaki Mizuno, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 75 days.

(21) Appl. No.: 16/729,691

(22) Filed: Dec. 30, 2019

(65) Prior Publication Data
US 2020/0273625 A1  Aug. 27, 2020

Related U.S. Application Data

(63) Continuation of application No. PCT/JP2019/033360, filed on Aug. 26, 2019.

(30) Foreign Application Priority Data

Feb. 22, 2019  (JP) .............................. JP2019-030601

(51) Int. Cl.
*H01L 21/02* (2006.01)
*H01G 7/06* (2006.01)
*H01L 27/10* (2006.01)
*H01L 27/02* (2006.01)
*H01L 27/06* (2006.01)
*H01L 27/07* (2006.01)

(52) U.S. Cl.
CPC .............. *H01G 7/06* (2013.01); *H01L 27/10* (2013.01); *H01L 27/0248* (2013.01); *H01L 27/0676* (2013.01); *H01L 27/0788* (2013.01)

(58) Field of Classification Search
CPC ............. H01L 27/0248; H01L 27/0682; H01L 27/0794; H01L 27/101; H01L 29/93
See application file for complete search history.

(56) References Cited

U.S. PATENT DOCUMENTS

2015/0294795 A1*  10/2015  Ueki ........................ H03H 5/02
361/56
2016/0351556 A1*  12/2016  Nakaiso ................ B81B 7/0022

FOREIGN PATENT DOCUMENTS

| JP | 2005064437 A | * | 3/2005 |
| JP | 2005064437 A | | 3/2005 |
| WO | 2014155862 A1 | | 10/2014 |

(Continued)

OTHER PUBLICATIONS

International Search Report issued for PCT/JP2019/033360, dated Oct. 8, 2019 (Japanese language).

*Primary Examiner* — Calvin Y Choi
(74) *Attorney, Agent, or Firm* — Arent Fox LLP

(57) ABSTRACT

A variable capacitance element is provided that includes a plurality of resistance elements that form a path for applying a control voltage to the electrodes of a plurality of variable capacitance portions connected in series. These resistance elements include first distribution resistance elements, second distribution resistance elements, a first shared resistance element, and a second shared resistance element. Moreover, vertical sectional areas of the first shared resistance element and the second shared resistance element with respect to conducting directions thereof are larger than the vertical sectional areas of the first distribution resistance elements and the second distribution resistance elements with respect to conducting directions thereof.

20 Claims, 11 Drawing Sheets

(56) References Cited

FOREIGN PATENT DOCUMENTS

| WO | WO-2014155862 A1 | * | 10/2014 | ............... H02H 7/16 |
| WO | 2015151786 A1 | | 10/2015 | |
| WO | WO-2015151786 A1 | * | 10/2015 | ........... B81B 7/0022 |

* cited by examiner

VARIABLE CAPACITANCE ELEMENT

CROSS REFERENCE TO RELATED APPLICATIONS

The present application is a continuation of PCT/JP2019/033360 filed Aug. 26, 2019, which claims priority to Japanese Patent Application No. 2019-030601, filed Feb. 22, 2019, the entire contents of each of which are incorporated herein by reference.

TECHNICAL FIELD

The present invention relates to a capacitance element, and more particularly to a variable capacitance element.

BACKGROUND

Japanese Unexamined Patent Publication No. 2005-064437 discloses a conventional variable capacitance element that includes a dielectric layer whose dielectric constant changes in accordance with application of a control voltage; electrodes sandwiching the dielectric layer; and wiring for applying a control voltage to these electrodes. Such a variable capacitance element adopts a stack structure (MIM structure) of metal, ferroelectric material, and metal and includes a thin film of ferroelectric such that a large capacitance change can be obtained at a low voltage.

However, such variable capacitance elements that include a ferroelectric film suffer from a drawback in that such a variable capacitance element is low in ESD (Electro-Static Discharge) resistance characteristic, compared to a variable capacitance element formed by MEMS and a variable capacitance element of a semiconductor such as variable capacitance diode.

To increase control sensitivity (i.e., the ratio of a capacitance value change to a control voltage change), it is effective to reduce the thickness of the ferroelectric film. However, as the ferroelectric film becomes thinner, the ESD resistance characteristic degrades. That is, when ESD exceeds the ESD resistance characteristic, its surge is applied to the ferroelectric film, which is then dielectrically broken down.

Meanwhile, International Publication No. 2014/155862 discloses a variable capacitance element in which a capacitor having a capacitance larger than a variable capacitance portion is provided so that a surge current caused by ESD is bypassed to the capacitor. It is effective to provide a bypass path in terms of protection of the ferroelectric film against ESD, as disclosed in International Publication No. 2014/155862.

Incidentally, the variable capacitance element requires a path for applying the control voltage to the variable capacitance portion. However, conventionally, there has been no views about protecting the path for applying the control voltage from ESD.

SUMMARY

Accordingly, the exemplary embodiments of the present invention provide a variable capacitance element having a high ESD resistance characteristic with respect to a path for applying a control voltage to a variable capacitance portion.

In an exemplary embodiment, a variable capacitance element of the present disclosure is provided that includes a plurality of variable capacitance portions connected in series, each including a dielectric layer whose dielectric constant is determined in accordance with electric field strength and electrodes sandwiching the dielectric layer; and a plurality of resistance elements that form a path for applying a control voltage to the electrodes of the plurality of variable capacitance portions. The plurality of resistance elements are defined by resistance film patterns provided at a substrate. The plurality of resistance elements include first distribution resistance elements having first ends each connected to each of the electrodes of the plurality of variable capacitance portions and second ends connected to a first common connection portion; second distribution resistance elements having first ends each connected to each of the electrodes of the plurality of variable capacitance portions and second ends connected to a second common connection portion; a first shared resistance element having a first end connected to the first common connection portion and a second end connected to a first control voltage input terminal; and a second shared resistance element having a first end connected to the second common connection portion and a second end connected to a second control voltage input terminal. According to the exemplary embodiment, vertical sectional areas of the first shared resistance element and the second shared resistance element with respect to conducting directions thereof are larger than vertical sectional areas of the first distribution resistance elements and the second distribution resistance elements with respect to conducting directions thereof.

According to an exemplary embodiment of the present invention, a variable capacitance element is provided that has a high ESD resistance characteristic with respect to a path for applying a control voltage to variable capacitance portions.

DETAILED DESCRIPTION

Several specific examples will now be given with reference to the drawings, to disclose a plurality of exemplary embodiments according to the present invention. In each drawing, the same portions are labelled with the same symbol. In consideration of the explanation of main points or ease of understanding, the plurality of embodiments are separately given for convenience of explanation. However, partial replacement or combination of the configurations disclosed in the different embodiments is possible. In the second and subsequent embodiments, descriptions of matters common to the first embodiment are omitted, and only different points will be described. In particular, the same operation effect by the same configuration will not be sequentially described for each embodiment.

First Exemplary Embodiment

Figure 1:
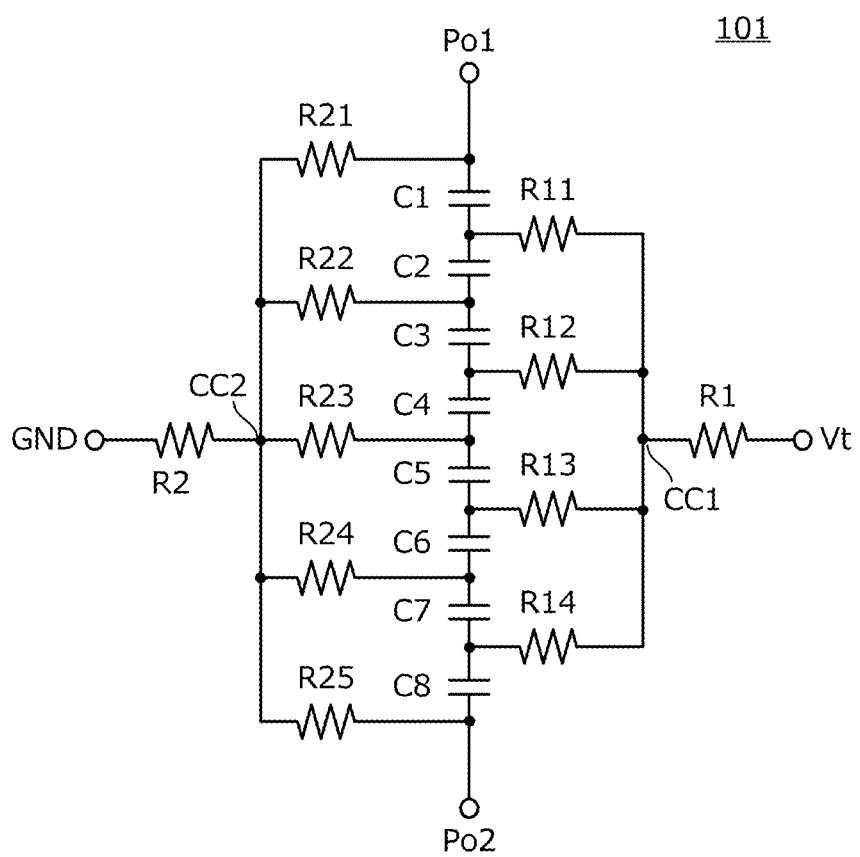
FIG. 1 is a circuit diagram of a variable capacitance element 101 according to a first exemplary embodiment.

FIG. 1 is a circuit diagram of a variable capacitance element 101 according to the first exemplary embodiment. As shown, the variable capacitance element 101 includes a plurality of variable capacitance portions C1 to C8 connected in series (e.g., between Po1 and Po2), and a plurality of resistance elements R1, R11 to R14, R2, and R21 to R25. The plurality of resistance elements R1, R11 to R14, R2, and R21 to R25 form a path for applying a control voltage to the electrodes of the plurality of variable capacitance portions C1 to C8.

Capacitance values of the variable capacitance portions C1 to C8 are determined according to a control voltage applied between a control voltage input terminal Vt and a ground terminal GND. Thereby a capacitance value between a first input/output terminal Po1 and a second input/output terminal Po2 is determined.

According to the exemplary embodiment, each of the variable capacitance portions C1 to C8 is a ferroelectric capacitor that includes a ferroelectric film whose dielectric constant changes depending on an electric field; and electrodes that sandwich the ferroelectric film and apply a voltage thereto. Since the dielectric constant of the ferroelectric film changes as the amount of polarization changes according to the intensity of the applied electric field, the capacitance value between the electrodes is determined according to a control voltage. A control voltage is applied to the electrodes of each variable capacitance portion via resistance elements R1, R11 to R14, R2, R21 to R25.

Among the plurality of resistance elements, the resistance elements R11 to R14 are first distribution resistance elements having first ends connected to electrodes of the variable capacitance portions C1 to C8 and second ends connected to first common connection portion CC1. The resistance element R1 is a first shared resistance element having a first end connected to the first common connection portion CC1 and a second end connected to the control voltage input terminal Vt. The resistance elements R21 to R25 are second distribution resistance elements having first ends connected to the electrodes of the variable capacitance portions C1 to C8 and second ends connected to a second common connection portion CC2. The resistance element R2 is a second shared resistance element having a first end connected to the second common connection portion CC2 and a second end connected to the ground terminal GND. According to the exemplary embodiment, the control voltage input terminal Vt can be provided as a first control voltage input terminal and the ground terminal GND can be provided as second control voltage input terminal.

The resistance elements R1, R11 to R14, R2, and R21 to R25 apply a control voltage to each of the variable capacitance portions C1 to C8 and act as a choke resistor that prevents an RF signal applied between the first input/output terminal Po1 and the second input/output terminal Po2 from leaking into the control voltage input terminal Vt and the ground terminal GND.

Figure 2A:
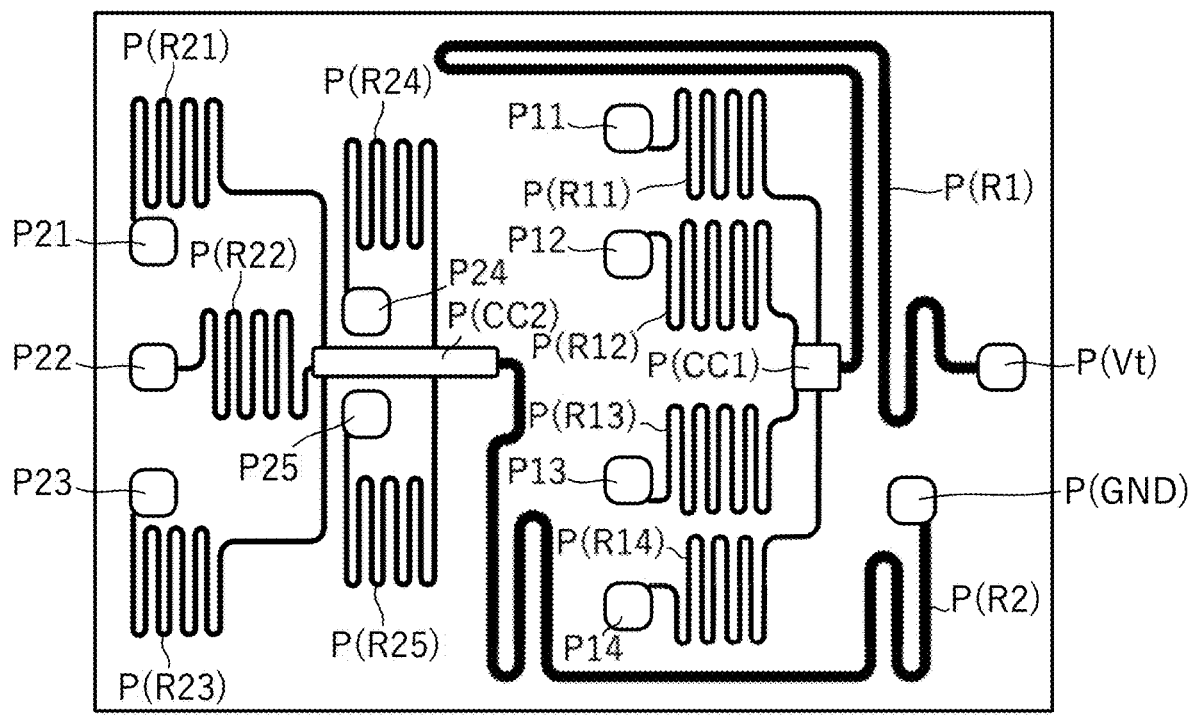
FIG. 2A is a plan view showing an example of a resistance film patterns composing a plurality of resistance elements of the variable capacitance element according to the first exemplary embodiment.
Figure 2B:
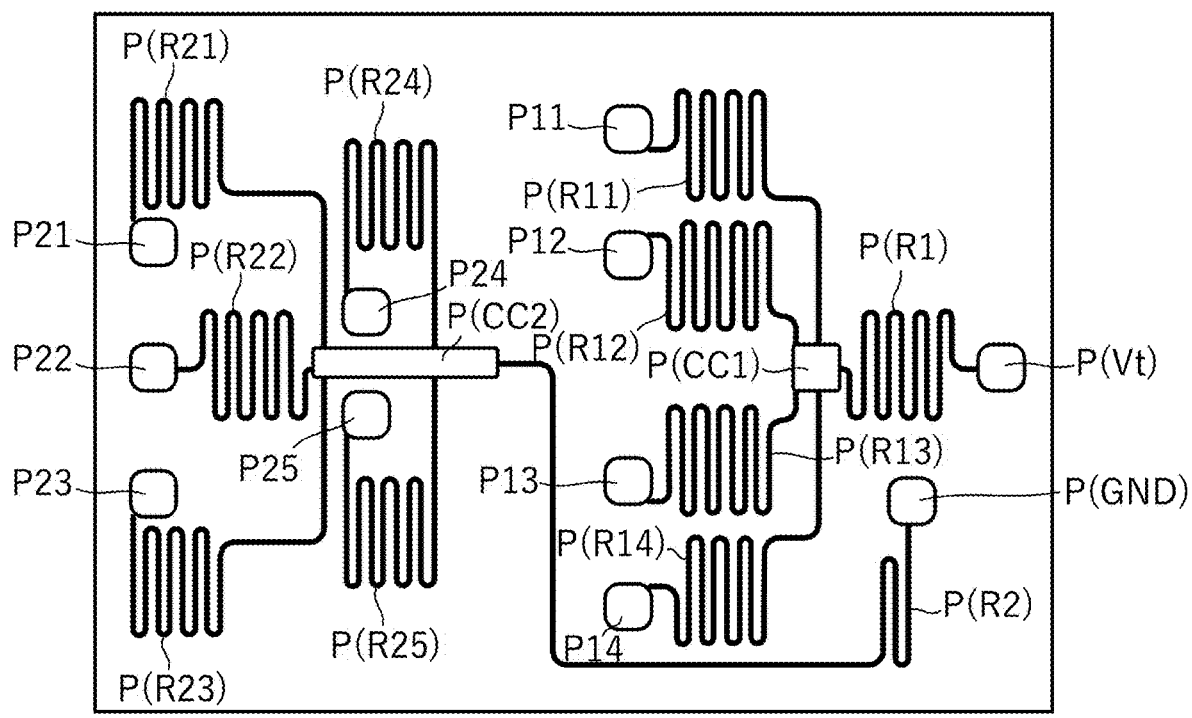
FIG. 2B is a plan view showing an example of resistance film patterns as a comparative example.

FIG. 2A is a plan view showing an example of a resistance film pattern composing a plurality of resistance elements of the variable capacitance element according to the present embodiment. FIG. 2B is a plan view showing an example of a resistance film pattern as a comparative example.

As shown in FIG. 2A, the plurality of resistance elements of the variable capacitance element according to the present embodiment is composed of a plurality of resistance film patterns formed in a resistance film pattern formation layer. In FIG. 2A, P(R1), P(R11) to P(R14), P(R2), and P(R21) to P(R25) are resistance film patterns respectively composing the resistance elements R1, R11 to R14, R2, R21 to R25, shown in FIG. 1 and described above. P(CC1) is a conductor pattern for the first common connection portion CC1, and P(CC2) is a conductor pattern for the second common connection portion CC2. P(Vt) is a connection to the control voltage input terminal Vt, and P(GND) is a connection to the ground terminal GND.

In FIG. 2A, P11 to P14 and P21 to P25 are connections to the respective electrodes of the variable capacitance portions C1 to C8. As will be described later, the variable capacitance portion is formed in a layer different from the formation layer of these resistance film patterns.

According to the exemplary embodiment, the resistance values of the resistance elements defined by the resistance film patterns P(R11) to P(R14) and P(R21) to P(R25) composing distribution resistance elements R11 to R14 and R21 to R25 are all equal. Thus, the line widths of the resistance film patterns P(R11) to P(R14) and P(R21) to P(R25) are all equal.

Meanwhile, the line widths of the resistance film patterns P(R1) and P(R2) composing the shared resistance elements R1 and R2 are wider than the line widths of the resistance film patterns P(R11) to P(R14) and P(R21) to P(R25). In the present embodiment, the thickness of the resistance film is constant.

If the foregoing is generally expressed, vertical sectional areas of the resistance film patterns P(R1) and P(R2) composing the shared resistance elements R1 and R2 with respect to conducting directions thereof are larger than vertical sectional areas of the resistance film patterns P(R11) to P(R14) and P(R21) to P(R25) composing the distribution resistance elements R11 to R14 and R21 to R25 with respect to conducting directions thereof.

Figure 3:
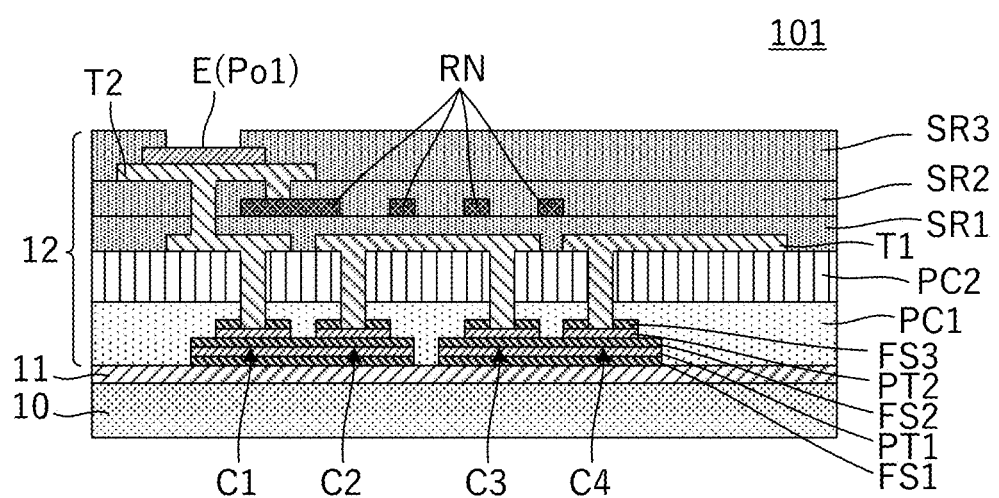
FIG. 3 is a longitudinal sectional view of the variable capacitance element 101.

FIG. 3 is a longitudinal sectional view of the variable capacitance element 101. In the cross section shown in FIG. 3, the variable capacitance portions C1, C2, C3, and C4 are shown. The other variable capacitance portions C5 to C8 are not shown in the cross section shown in FIG. 3.

The variable capacitance element 101 includes a semiconductor substrate 10, an SiO$_2$ film 11, and a rewiring layer 12. On the SiO$_2$ film 11, the variable capacitance portions C1, C2, C3, C4 are composed by forming a ferroelectric film FS1, a capacitor electrode PT1, a ferroelectric film FS2, a capacitor electrode PT2, and a ferroelectric film FS3 in order such that the ferroelectric film and the electrode are alternated.

The capacitor electrodes PT1, PT2 are formed, for example, by patterning a Pt film. The ferroelectric films FS1, FS2, FS3 are formed of, for example, a BST film.

The top of the stack film formed from these ferroelectric films FS1, FS2, FS3 and capacitor electrodes PT1, PT2 is covered with a moisture-resistant protective film PC1. An organic protective film PC2 is also formed on the moisture-resistant protective film PC1.

A wiring film T1 is formed on the organic protective film PC2. In addition, the wiring film T1 is connected to a predetermined portion of the capacitor electrode PT1, PT2 through a contact hole.

An interlayer insulating film SR1 is formed on the surface of the wiring film T1. A resistance film pattern RN is formed on the surface of the interlayer insulating film SR1. The surface of the resistance film pattern RN is covered with an interlayer insulating film SR2, and the surface of the interlayer insulating film SR2 is covered with a solder resist film SR3.

According to exemplary aspects, the above resistance film pattern RN is formed by a thin film process (e.g., a process using photolithography and etching techniques) or a thick film process (e.g., a process using printing techniques such as screen printing). The resistance value of each resistance element is determined according to the width, length and thickness of the resistance film pattern.

A wiring film T2 is formed on the surface of the interlayer insulating film SR2. The wiring film T2 is connected to the wiring film T1 through a contact hole formed in the interlayer insulating films SR1, SR2.

An input/output terminal electrode E(Po1) is formed in the opening of the solder resist film SR3 and on the surface of the wiring film T2. An electrode for the input/output terminal Po2 is not shown in the cross section shown in FIG. 3.

The ferroelectric film FS1 is an insulating film for adhesion and diffusion prevention with respect to the semiconductor substrate 10 and the moisture-resistant protective film PC1. The ferroelectric film FS3 is an insulating film for adhesion to the moisture-resistant protective film PC1. As a conductive material used for the capacitor electrodes PT1, PT2, a high melting point noble metal material having good conductivity and excellent oxidation resistance, for example, Pt, Au, can be used.

As a thin film material used for the ferroelectric films FS1, FS2, FS3, a dielectric material having a high dielectric constant is used. Specifically, perovskite compounds such as (Ba, Sr)TiO$_3$ (BST), SrTiO$_3$, BaTiO$_3$, and Pb(Zr, Ti)O$_3$, bismuth layered compounds such as SrBi$_4$Ti$_4$O$_{15}$, or the like can be used, for example.

The wiring films T1, T2 are composed of three layers of Ti, Cu, Ti. The input/output terminal electrode E(Po1) is composed of two layers of Au, Ni. The moisture-resistant protective film PC1 is made of SiNx, SiO$_2$, Al$_2$O$_3$, TiO$_2$, or the like. The organic protective film PC2 absorbs mechanical stress from outside. The organic protective film PC2 is made of PBO (polybenzoxazole) resin, polyimide resin, epoxy resin, or the like. The resistance material of the resistance film pattern RN is, for example, NiCr.

Figure 4A:
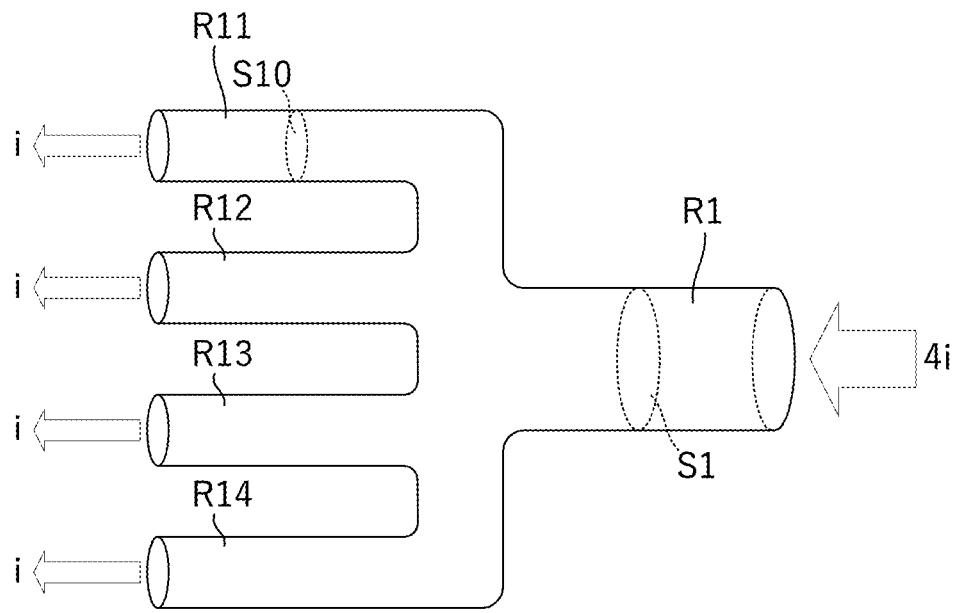
FIG. 4A is a diagram showing the relation between distribution resistance elements R11 to R14 and the shared resistance element R1 in terms of vertical sectional area with respect to conducting direction.
Figure 4B:
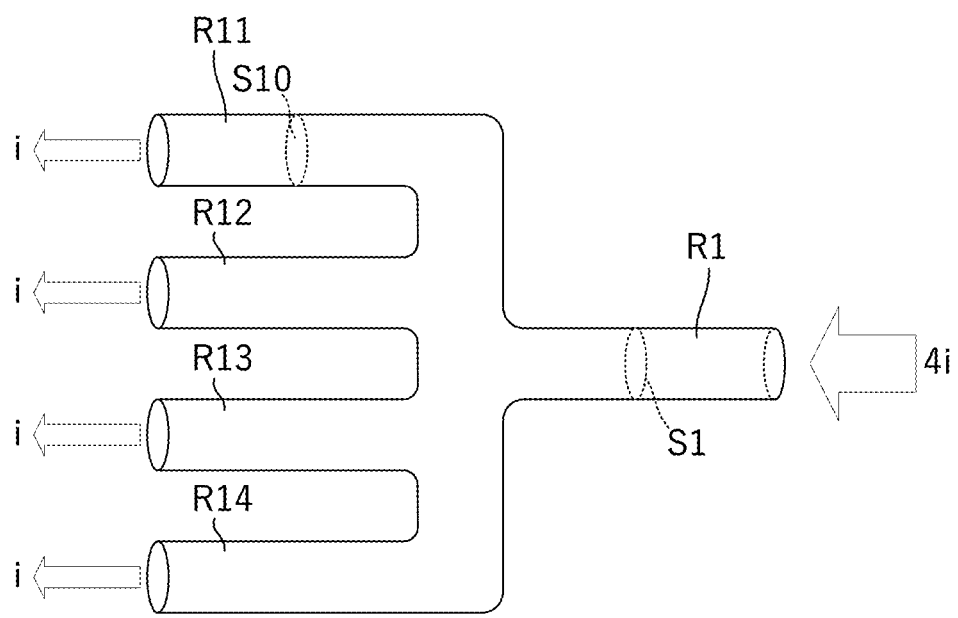
FIG. 4B is a diagram showing the relation between the distribution resistance elements R11 to R14 and the shared resistance element R1 in terms of vertical sectional area with respect to conducting direction, as a comparative example.

FIG. 4A is a diagram showing the relation between the distribution resistance elements R11 to R14 and the shared resistance element R1 in terms of vertical sectional area with respect to conducting direction. FIG. 4B is a diagram, as a comparative example, showing the relation between the distribution resistance elements R11 to R14 and the shared resistance element R1 in terms of vertical sectional area with respect to conducting direction.

In the present embodiment, a vertical sectional area S1 (i.e., the cross-sectional area) of the shared resistance element R1 is larger than a vertical sectional area S10 (i.e., the cross-sectional area) of each of the distribution resistance elements R11 to R14. For example, S1=4×S10. In the comparative example, S1=S10.

In both the examples shown in FIGS. 4A and 4B, the total current 4i of currents i flowing in the respective distribution resistance elements R11 to R14 flows in the shared resistance element R1. The density J1 of the current flowing in the shared resistance element R1 is J1=4i/S1, and the density J10 of the current flowing in the distribution resistance elements R11 to R14 is J10=i/S10. In the comparative example shown in FIG. 4B, since S1=S10, a relation of J1=4×J10 is established, and the shared resistance element R1 becomes a current bottleneck. That is, when a large current flows in a plurality of resistance elements that form a path for applying a control voltage to the electrodes of the variable capacitance portion, the shared resistance element R1 is disconnected (burned out). Therefore, the ESD resistance of the path for applying the control voltage to the electrodes of the variable capacitance portion is determined by the resistance of the shared resistance element R1. On the other hand, in the example shown in FIG. 4A, since S1=4×S10, a relationship of J1=J10 is established, and the shared resistance element R1 does not become a current bottleneck. Therefore, the ESD resistance of the path for applying the control voltage to the electrodes of the variable capacitance portion is higher than (four times) that of the comparative example shown in FIG. 4B.

FIGS. 4A and 4B show the first distribution resistance elements R11 to R14 and the first shared resistance element R1, but the same applies to the relation between the second distribution resistance elements R21 to R25 and the second shared resistance element R2.

Figure 5:
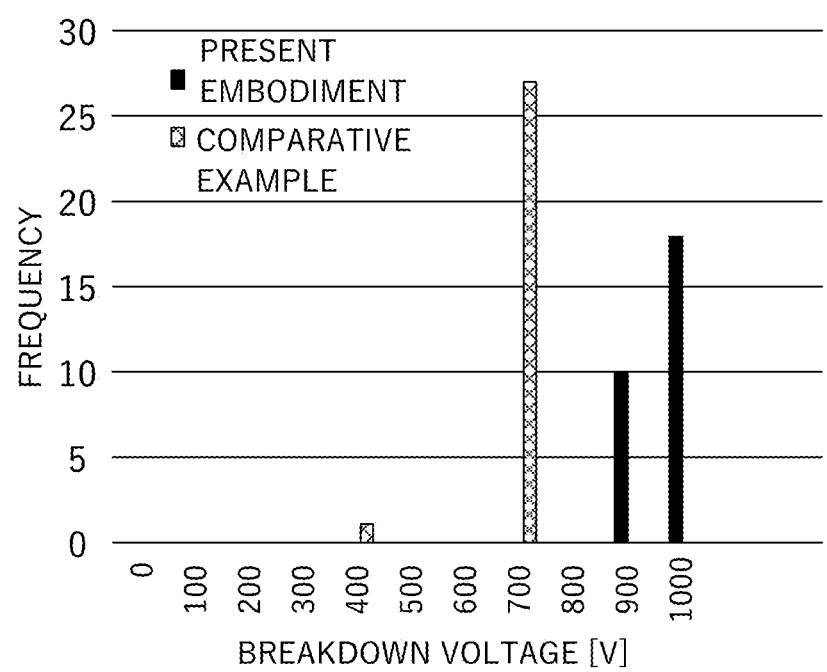
FIG. 5 is a diagram showing an example of the ESD resistance characteristic of the variable capacitance elements shown in FIGS. 2A and 2B.

FIG. 5 is a diagram showing an example of the ESD resistance characteristic of the variable capacitance element shown in FIGS. 2A and 2B. In FIG. 5, the horizontal axis represents breakdown voltage, and the vertical axis represents breakdown frequency. Here, the "breakdown voltage" is a voltage which is applied between the control voltage input terminal Vt and the ground terminal GND and at which any one of the resistance elements R1, R11 to R14, R2, R21 to R25 breaks down when a voltage applied between the control voltage input terminal Vt and the ground terminal GND is gradually increased from 0V.

In the comparative example shown in FIG. 2B, the breakdown frequency is high when the voltage exceeds about 700 V, whereas, in the present embodiment, breakdown does not occur when the voltage is below about 900 V. Accordingly, the exemplary embodiment provides an improved breakdown voltage when compared with conventional configurations as described above.

Second Exemplary Embodiment

Figure 6:
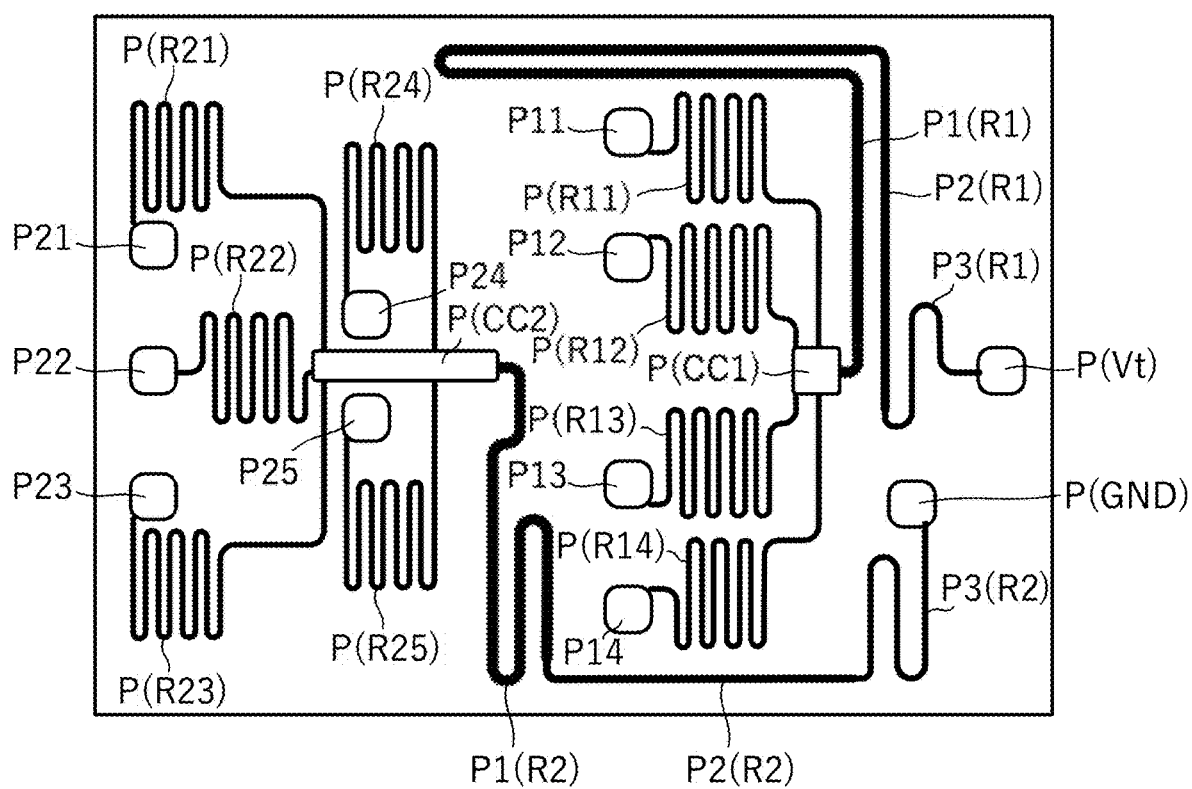
FIG. 6 is a plan view showing an example of resistance film patterns composing a plurality of resistance elements of a variable capacitance element according to a second exemplary embodiment.

In the second embodiment, another example of a resistance film pattern composing a plurality of resistance elements of a variable capacitance element is shown. FIG. 6 is a plan view showing an example of a resistance film pattern composing a plurality of resistance elements of the variable capacitance element according to the second embodiment.

The example shown FIG. 6 is different from the example shown in FIG. 2A in resistance film patterns composing the shared resistance elements R1, R2.

In FIG. 6, P(R1), P(R11) to P(R14), P(R2), P(R21) to P(R25) are resistance film patterns respectively composing the resistance elements R1, R11 to R14, R2, R21 to R25 shown in FIG. 1. The first shared resistance element R1 includes a resistance film pattern P1(R1), a resistance film pattern P2(R1), and a resistance film pattern P3(R1) which are different from each other in line width.

Here, if the line width of the resistance film pattern P1(R1) is W1(R1), the line width of the resistance film pattern P2(R1) is W2(R1), and the line width of the resistance film pattern P3(R1) is W3(R1) and, in addition, the line width of each of the resistance film patterns P(R11), P(R12), P(R13), P R14) is W(R10), then a relation of W1(R1)>W2(R1)>W3(R1)>W(R10) is established.

Similarly, if the line width of the resistance film pattern P1(R2) is W1(R2), the line width of the resistance film pattern P2(R2) is W2(R2), and the line width of the resistance film pattern P3(R2) is W3(R2) and, in addition, the line width of each of the resistance film patterns P(R21), P(R22), P(R23), P(R24), P(R25) is W(R20), then a relation of W1(R2)>W2(R2)>W3(R2)>W(R20) is established.

In this example, since the thickness of the resistance film pattern is constant, the above-described relations between the line widths correspond to the relations between the vertical sectional areas of the resistance film patterns.

As described above, the vertical sectional area of the first shared resistance element R1 with respect to the conducting direction thereof does not have to be constant and may change at a certain point between the ends thereof as shown in FIG. 6. Furthermore, changes in line width or vertical sectional area do not have to be stepwise but may be continuous. Even in that case, if the smallest cross-sectional area of the vertical sectional area of each of the shared resistance elements R1, R2 with respect to the conducting direction thereof is larger than the vertical sectional area of each of the distribution resistance elements R11 to R14 and R21 to R25 with respect to the conducting direction thereof, the shared resistance elements R1, R2 do not become the bottleneck mentioned above.

Third Exemplary Embodiment

Figure 7:
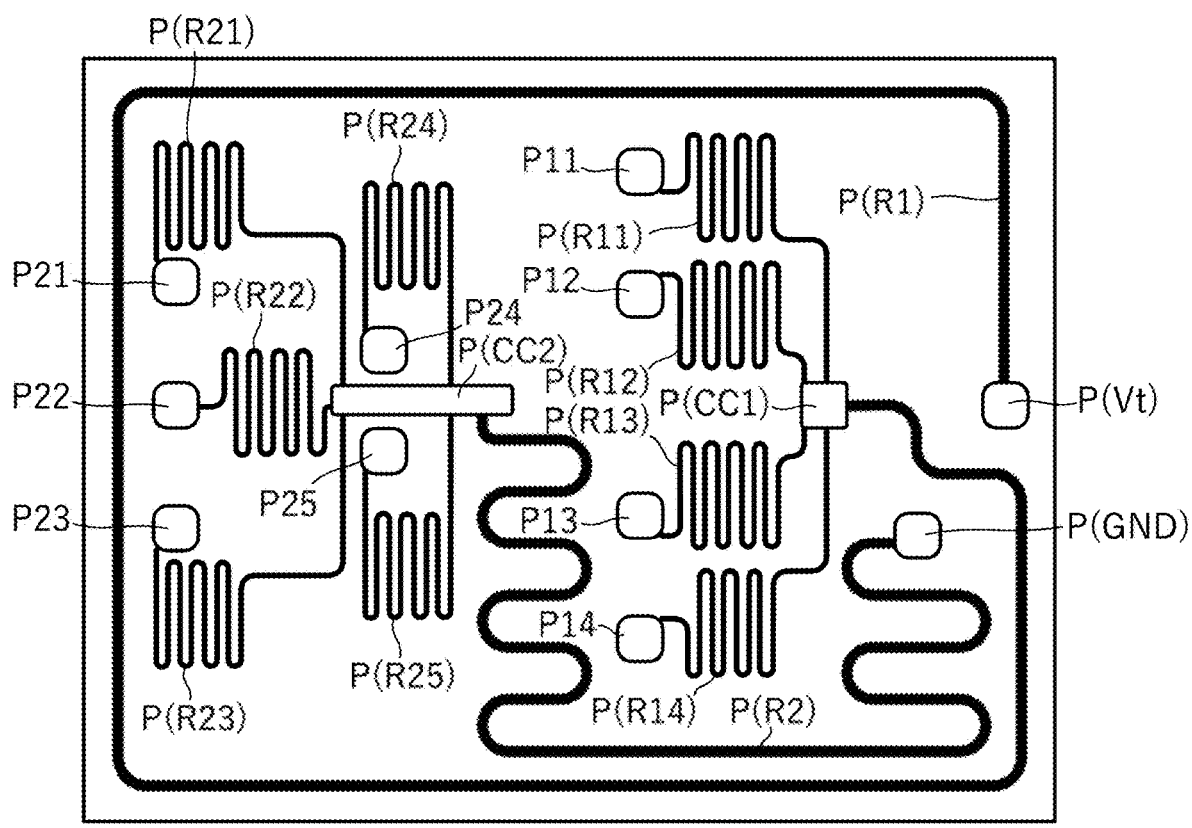
FIG. 7 is a plan view of resistance film patterns composing a plurality of resistance elements of a variable capacitance element according to a third exemplary embodiment.

In the third exemplary embodiment, an example of a resistance film patterns composing a plurality of resistance elements of a variable capacitance element is shown. FIG. 7 is a plan view of resistance film patterns composing a plurality of resistance elements of the variable capacitance element according to the third embodiment.

In FIG. 7, P(R1), P(R11) to P(R14), P(R2), P(R21) to P(R25) are resistance film patterns respectively composing the resistance elements R1, R11 to R14, R2, R21 to R25 shown in FIG. 1.

The minimum curvature radius of the curved portions of each of the resistance film patterns P(R1) and P(R2) composing the shared resistance elements R1, R2 is larger than the minimum curvature radius of the resistance film patterns P(R11) to P(R14) and P(R21) to P(R25) of the distribution resistance elements. In other words, in terms of "curvature", the maximum curvature of the curved portions of each of the resistance film patterns P(R1) and P(R2) composing the shared resistance elements R1 and R2 is smaller than the maximum curvature of the resistance film patterns P(R11) to P(R14), P(R21) to P(R25) of the distribution resistance elements.

Figure 8:
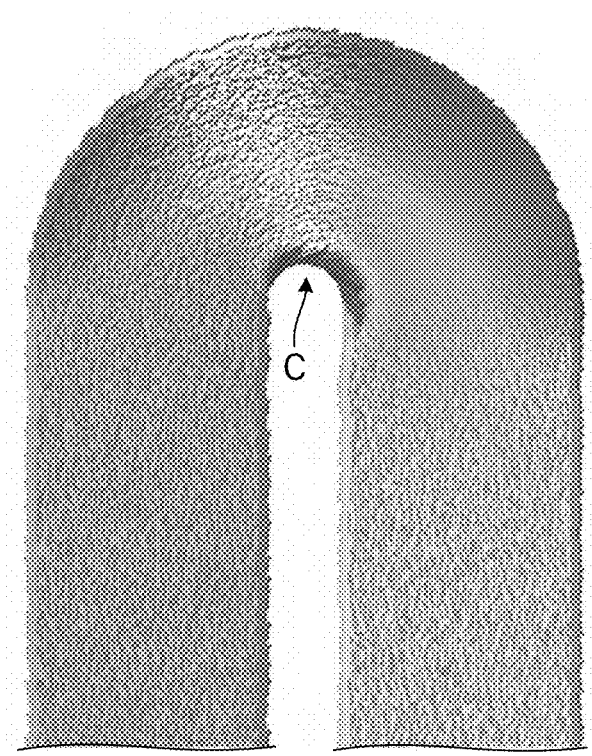
FIG. 8 is a diagram showing a current density distribution of a folded portion of a conductor pattern.

FIG. 8 is a diagram showing a current density distribution of a folded portion of a conductor pattern. In general, if a folded portion exists in the conductor pattern, current density in an inner peripheral portion (a portion indicated by C in FIG. 8) of the folded portion is higher than that in the other portion. That is, since current concentrates on the inner periphery of the folded portion, breakdown by ESD begins from the inner periphery of the folded portion.

Figure 9:
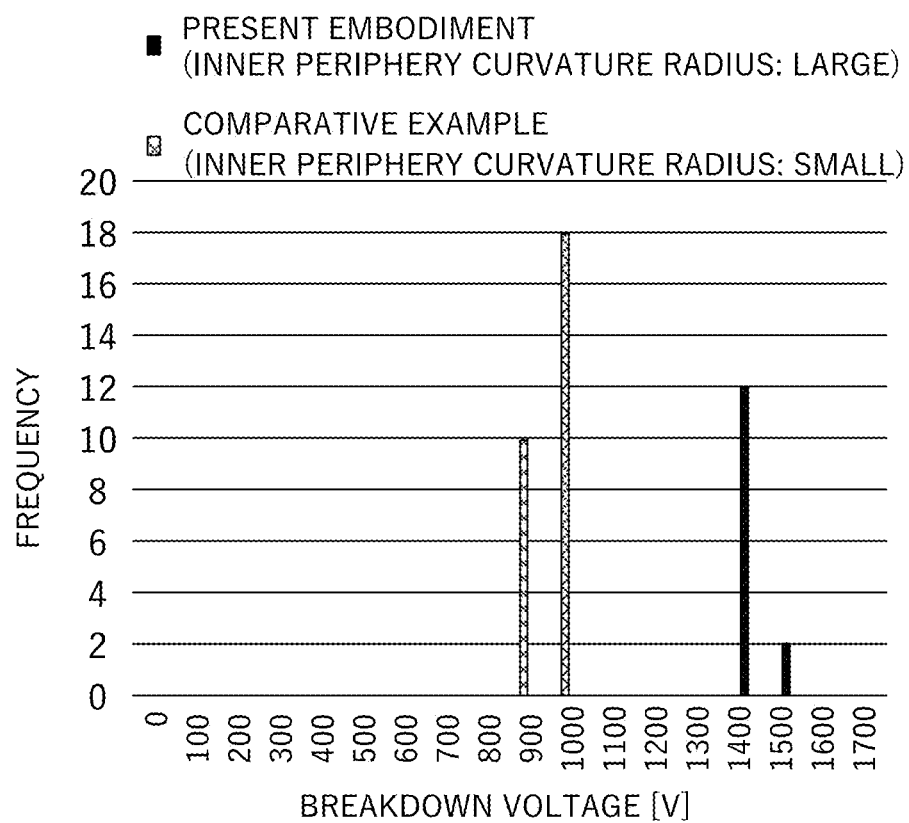
FIG. 9 is a diagram showing an example of the ESD resistance characteristic of the variable capacitance element shown in FIG. 7.

FIG. 9 is a diagram showing an example of ESD resistance characteristic of the variable capacitance element shown in FIG. 7. In FIG. 9, the horizontal axis represents the breakdown voltage, and the vertical axis represents the breakdown frequency. Here, the "breakdown voltage" is a voltage which is applied between the control voltage input terminal Vt and the ground terminal GND and at which any one of the resistance elements R1, R2 breaks down when a voltage applied between the control voltage input terminal Vt and the ground terminal GND is gradually increased from 0V. The "Comparative example" in FIG. 9 shows the ESD resistance characteristic of the variable capacitance element shown in FIG. 2A. Thus, in this embodiment, since the minimum curvature radius of the curved portions of each of the resistance film patterns P(R1), P(R2) composing the shared resistance elements R1, R2 having a large amount of current is large, the ESD resistance of each of the resistance film patterns P(R1), P(R2) composing the shared resistance elements R1, R2 increases.

Fourth Exemplary Embodiment

In the fourth exemplary embodiment, an example of a variable capacitance element in which the ESD resistance of a variable capacitance portion is increased will be described.

Figure 10:
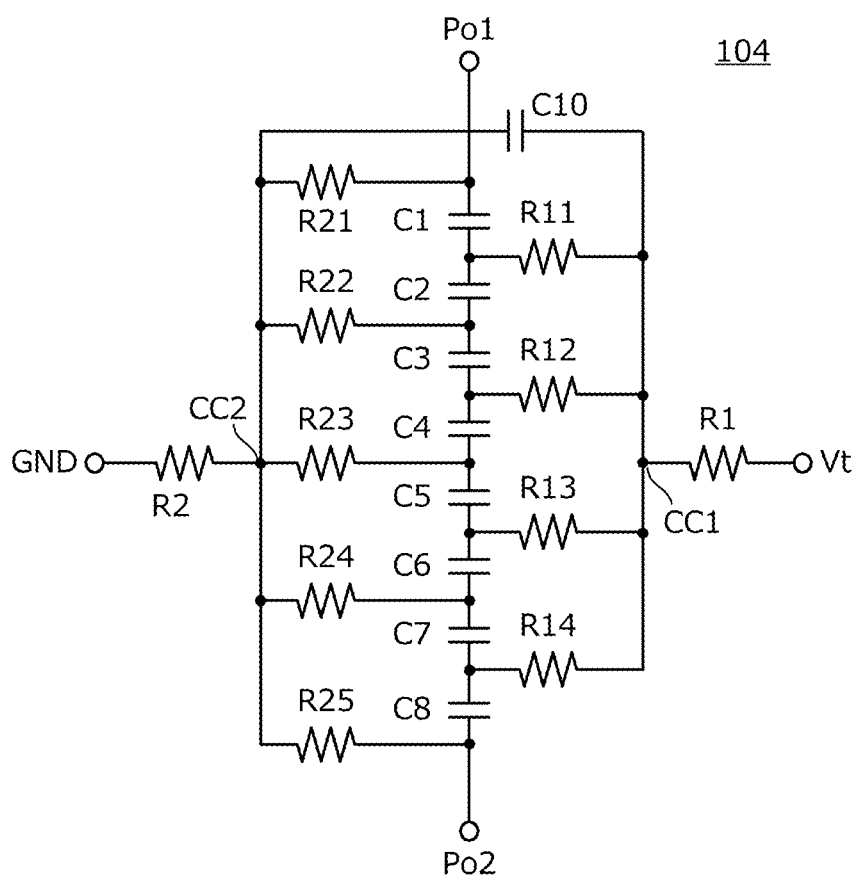
FIG. 10 is a circuit diagram of a variable capacitance element 104 according to a fourth exemplary embodiment.

FIG. 10 is a circuit diagram of the variable capacitance element 104 according to the fourth embodiment. Similar to the exemplary embodiment shown in FIG. 1, the variable capacitance element 104 includes a plurality of variable capacitance portions C1 to C8 connected in series, and a plurality of resistance elements R1, R11 to R14, R2, R21 to R25, but also includes a capacitor C10. The plurality of resistance elements R1, R11 to R14, R2, and R21 to R25 form a path for applying a control voltage to the electrodes of the plurality of variable capacitance portions C1 to C8. According to this exemplary embodiment, the capacitor C10 is a surge current bypass capacitor. The configuration other than the surge current bypass capacitor C10 is the same as that of the variable capacitance element 101 shown in the first embodiment.

If, for example, a high voltage caused by ESD is applied to the control voltage input terminal Vt in a state where the surge current bypass capacitor C10 is not present, a high voltage is applied to the variable capacitance portions C1 to C8.

In the variable capacitance element 104, since the surge current bypass capacitor C10 is present, surge current caused by ESD flows in the path in the following order: the control voltage input terminal Vt→the resistance element R1→the capacitor C10→the resistance element R2→the ground terminal GND. Consequently, application of a high voltage to the variable capacitance portions C1 to C8 is hindered. This increases the ESD resistance for the variable capacitance portions.

The surge current flows in the shared resistance elements R1, R2; however, as shown in the first to third embodiments, the ESD resistance of each of the resistance elements R1, R2 is high, making it possible to prevent breakdown of the resistance elements R1, R2.

Fifth Exemplary Embodiment

In the fifth embodiment, an example of a variable capacitance element including an ESD protection element is shown.

Figure 11:
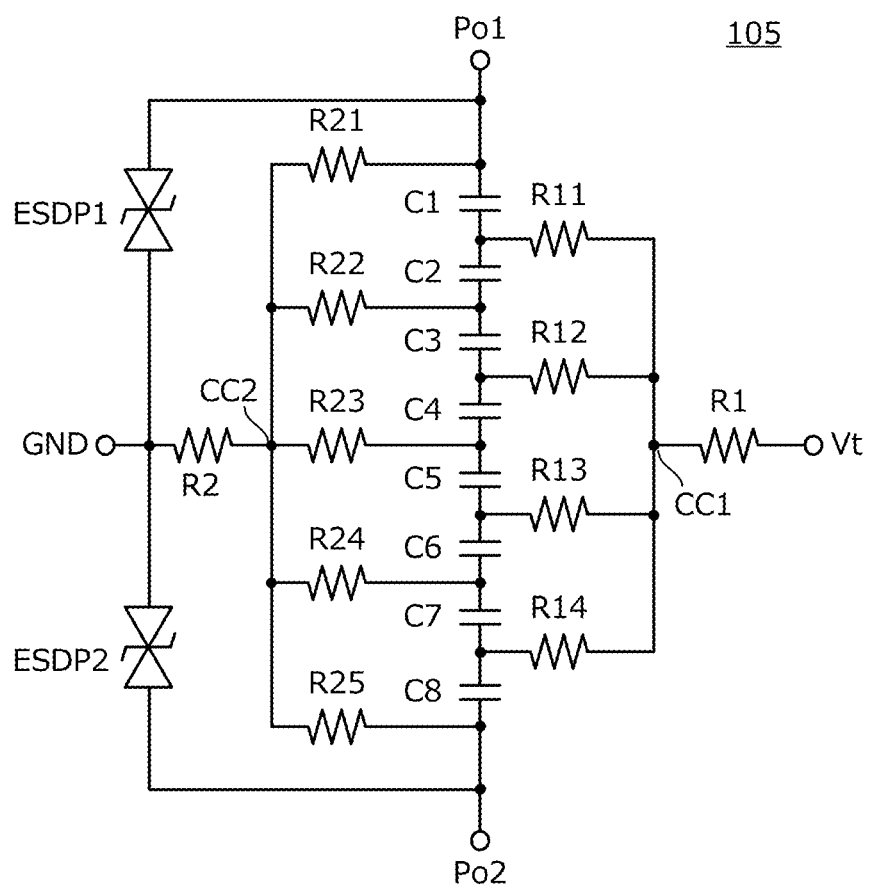
FIG. 11 is a circuit diagram of a variable capacitance element 105 according to a fifth exemplary embodiment.

FIG. 11 is a circuit diagram of a variable capacitance element 105 according to the fifth embodiment. Similar to the embodiment shown in FIG. 1, the variable capacitance element 105 includes a plurality of variable capacitance portions C1 to C8 connected in series, and a plurality of resistance elements R1, R11 to R14, R2, R21 to R25, but also includes ESD protection elements ESDP1 and ESDP2. The plurality of resistance elements R1, R11 to R14, R2, and R21 to R25 form a path for applying a control voltage to the electrodes of the plurality of variable capacitance portions C1 to C8.

An ESD protection element ESDP1 is connected between a first input/output terminal Po1 and a ground terminal GND, and an ESD protection element ESDP2 is connected between a second input/output terminal Po2 and a ground terminal GND. With such a configuration, even if an ESD surge enters the input/output terminals Po1, Po2 from outside, the surge current falls into the ground through the ESD protection elements ESDP1, ESDP2. Therefore, application of overvoltage to the variable capacitance portions C1 to C8 is prevented, protecting the variable capacitance portions C1 to C8.

Finally, it is noted that the descriptions of the above exemplary embodiments are illustrative in all respects and not restrictive. Thus, modifications and variations are possible as appropriate to those skilled in the art. The scope of the present invention is shown not by the above embodiments but by the claims. Furthermore, the scope of the present invention includes modifications from the embodiments within the scope of the claims and equivalents.

<Exemplary Aspects>

The exemplary aspects disclosed in the foregoing embodiments of the present invention will be listed below.

(Aspect 1)

The variable capacitance element 101 includes a plurality of variable capacitance portions C1 to C8 connected in series, each of the variable capacitance portions including a dielectric layer whose dielectric constant is determined in accordance with electric field strength and electrodes sandwiching the dielectric layer; and a plurality of resistance elements R1, R11 to R14, R2, and R21 to R25 that form a path for applying a control voltage to the electrodes of the plurality of variable capacitance portions C1 to C8. The plurality of resistance elements R1, R11 to R14, R2, R21 to R25 are defined by resistance film patterns P(R1), P(R11) to P(R14), P(R2), P(R21) to P(R25) provided at a substrate. The plurality of resistance elements include first distribution resistance elements R11 to R14 having first ends each connected to each of the electrodes of the plurality of variable capacitance portions C1 to C8 and second ends connected to a first common connection portion CC1; second distribution resistance elements R21 to R25 having first ends each connected to each of the electrodes of the plurality of variable capacitance portions C1 to C8 and second ends connected to a second common connection portion CC2; a first shared resistance element R1 having a first end connected to the first common connection portion CC1 and a second end connected to a control voltage input terminal (a control voltage input terminal Vt); and a second shared resistance element R2 having a first end connected to the second common connection portion CC2 and a second end connected to a control voltage input terminal (a ground terminal GND). In such a configuration, vertical sectional areas of the shared resistance elements R1, R2 with respect to conducting directions thereof are larger than vertical sectional areas of the distribution resistance elements R11 to R14 and R21 to R25 with respect to conducting directions thereof.

According to the foregoing configuration, a variable capacitance element is provided having a high ESD resistance characteristic with respect to a path for applying a control voltage to the variable capacitance portions C1 to C8.

(Aspect 2)

Among the plurality of resistance elements, the distribution resistance elements R11 to R14, R21 to R25 and the shared resistance elements R1, R2 are defined by resistance film patterns each having curved portions, and the minimum curvature radius of the curved portions of each of the resistance film patterns for the shared resistance elements R1, R2 is larger than the minimum curvature radius of the resistance film patterns for the distribution resistance elements R11 to R14, R21 to R25. With this configuration, the ESD resistance at the curved portions of each of the resistance film patterns for the shared resistance elements R1, R2 is increased.

(Aspect 3)

A surge current bypass capacitor C10 connected between a first common connection portion CC1 and a second common connection portion CC2 is provided. With this configuration, the resistance of the variable capacitance portions against ESD is increased while the resistance of the shared resistance elements against ESD surge current is maintained.

What is claimed:

1. A variable capacitance element comprising:
  a plurality of variable capacitance portions connected in series with each other and each including a dielectric layer with a dielectric constant that is determined in accordance with electric field strength and a pair of electrodes that sandwich the dielectric layer; and
  a plurality of resistance elements that form a path for applying a control voltage to the respective electrodes of the plurality of variable capacitance portions,
  wherein the plurality of resistance elements are formed by resistance film patterns provided at a substrate;
  wherein the plurality of resistance elements include:
    first distribution resistance elements having first ends each connected to the electrodes of the plurality of variable capacitance portions, respectively, and second ends connected to a first common connection portion;
    second distribution resistance elements having first ends each connected to the electrodes of the plurality of variable capacitance portions, respectively, and second ends connected to a second common connection portion;
    a first shared resistance element having a first end connected to the first common connection portion and a second end connected to a first control voltage input terminal; and
    a second shared resistance element having a first end connected to the second common connection portion and a second end connected to a second control voltage input terminal, and wherein vertical sectional areas of the first and second shared resistance elements with respect to current conducting directions thereof are larger than respective vertical sectional areas of the first and second distribution resistance elements with respect to current conducting directions thereof.

2. The variable capacitance element according to claim 1, wherein each of the first and second distribution resistance elements and the first and second shared resistance elements comprises resistance film patterns that each have a curved portion.

3. The variable capacitance element according to claim 2, wherein a minimum curvature radius of the respective curved portions of each of the resistance film patterns for the first and second shared resistance elements is larger than a minimum curvature radius of the resistance film patterns for the first and second distribution resistance elements.

4. The variable capacitance element according to claim 1, further comprising a surge current bypass capacitor connected between the first common connection portion and the second common connection portion.

5. The variable capacitance element according to claim 1, wherein the plurality of variable capacitance portions are connected in series between a first input/output terminal and a second input/output terminal.

6. The variable capacitance element according to claim 5, wherein the plurality of resistance elements are configured as a choke resistor configured to prevent an RF signal applied between the first and second input/output terminals from leaking into the first and second control voltage input terminals.

7. The variable capacitance element according to claim 6, wherein the first control voltage input terminal is a control voltage input terminal and the second control voltage input terminal is a ground terminal.

8. The variable capacitance element according to claim 5, further comprising:
a first ESD protection element connected between the first input/output terminal and the second control voltage input terminal; and
a second ESD protection element connected between the second input/output terminal and the second control voltage input terminal.

9. The variable capacitance element according to claim 1, wherein the vertical sectional areas of the first and second shared resistance elements and the first and second distribution resistance elements are cross-section areas orthogonally disposed relative to the current conducting directions of the respective elements.

10. The variable capacitance element according to claim 1, wherein each of the first and second shared resistance elements have varying line widths as the respective vertical sectional areas in the current conducting directions thereof.

11. A variable capacitance element comprising:
a plurality of variable capacitors connected in series with each other; and
a plurality of resistance elements providing a path to apply a control voltage to the plurality of variable capacitors, wherein the plurality of resistance elements are formed by resistance film patterns and include:
a plurality of first distribution resistance elements connected between a first common connection node and respective pairs of the plurality of variable capacitors, respectively;
a plurality of second distribution resistance elements connected between a second common connection node and respective pairs of the plurality of variable capacitors, respectively;
a first shared resistance element connected between the first common connection node and a first control voltage input terminal; and
a second shared resistance element connected between the second common connection node and a second control voltage input terminal, and
wherein the first and second shared resistance elements each comprise line widths in a current conducting direction thereof that are larger than respective line widths of the plurality of first and second distribution resistance elements in the current conducting direction.

12. The variable capacitance element according to claim 11, wherein the plurality of variable capacitors each comprise a dielectric layer with a dielectric constant that is determined in accordance with electric field strength and a pair of electrodes that sandwich the dielectric layer.

13. The variable capacitance element according to claim 11, wherein each of the first and second distribution resistance elements and the first and second shared resistance elements comprises resistance film patterns that each have a curved portion.

14. The variable capacitance element according to claim 13, wherein a minimum curvature radius of the respective curved portions of each of the resistance film patterns for the first and second shared resistance elements is larger than a minimum curvature radius of the resistance film patterns for the first and second distribution resistance elements.

15. The variable capacitance element according to claim 11, further comprising a surge current bypass capacitor connected between the first common connection node and the second common connection node.

16. The variable capacitance element according to claim 11, wherein the plurality of variable capacitors are connected in series between a first input/output terminal and a second input/output terminal.

17. The variable capacitance element according to claim 16,
wherein the plurality of resistance elements are configured as a choke resistor configured to prevent an RF signal applied between the first and second input/output terminals from leaking into the first and second control voltage input terminals, and
wherein the first control voltage input terminal is a control voltage input terminal and the second control voltage input terminal is a ground terminal.

18. The variable capacitance element according to claim 16, further comprising:
a first ESD protection element connected between the first input/output terminal and the second control voltage input terminal; and
a second ESD protection element connected between the second input/output terminal and the second control voltage input terminal.

19. The variable capacitance element according to claim 11, wherein the first and second shared resistance elements comprise cross-section areas that are orthogonally disposed relative to the current conducting directions and larger than respective cross-section areas of the plurality of first and second distribution resistance elements relative to the current conducting directions.

20. The variable capacitance element according to claim 11, wherein the respective line widths of each of the first and second shared resistance elements vary in width from a first end to a second end thereof.

\* \* \* \* \*